US008150051B2

(12) United States Patent
Jorgensen et al.

(10) Patent No.: US 8,150,051 B2
(45) Date of Patent: Apr. 3, 2012

(54) SYSTEM AND METHOD FOR SOUND SYSTEM SIMULATION

(75) Inventors: Morten Jorgensen, Southborough, MA (US); Christopher B. Ickler, Sudbury, MA (US)

(73) Assignee: Bose Corporation, Framingham, MA (US)

( * ) Notice: Subject to any disclaimer, the term of this patent is extended or adjusted under 35 U.S.C. 154(b) by 1146 days.

(21) Appl. No.: 11/954,539

(22) Filed: Dec. 12, 2007

(65) Prior Publication Data

US 2009/0154716 A1 Jun. 18, 2009

(51) Int. Cl.
*H03G 3/00* (2006.01)

(52) U.S. Cl. .............................. 381/63; 381/61; 381/58

(58) Field of Classification Search .................... 381/58, 381/63, 61
See application file for complete search history.

(56) References Cited

U.S. PATENT DOCUMENTS

| | | | | |
|---|---|---|---|---|
| 3,535,453 | A * | 10/1970 | Veneklasen | 381/64 |
| 5,263,019 | A * | 11/1993 | Chu | 370/288 |
| 5,467,401 | A * | 11/1995 | Nagamitsu et al. | 381/63 |
| 5,812,676 | A * | 9/1998 | Johnson, Jr. | 381/300 |
| 5,884,436 | A * | 3/1999 | Ebbitt | 52/79.4 |
| 6,895,378 | B1 * | 5/2005 | Meyer et al. | 704/270 |
| 7,069,219 | B2 * | 6/2006 | Meyer et al. | 704/270 |
| 7,096,169 | B2 * | 8/2006 | Crutchfield, Jr. | 703/7 |
| 7,805,286 | B2 * | 9/2010 | Jorgensen et al. | 703/7 |
| 2003/0007648 | A1 * | 1/2003 | Currell | 381/61 |
| 2004/0086131 | A1 * | 5/2004 | Ringlstetter et al. | 381/59 |
| 2006/0078130 | A1 * | 4/2006 | Jorgensen et al. | 381/61 |
| 2007/0253564 | A1 * | 11/2007 | Katayama et al. | 381/63 |
| 2009/0144036 | A1 * | 6/2009 | Jorgensen et al. | 703/6 |
| 2009/0154716 | A1 * | 6/2009 | Jorgensen et al. | 381/63 |
| 2010/0119075 | A1 * | 5/2010 | Xiang et al. | 381/63 |
| 2010/0150359 | A1 * | 6/2010 | KnicKrehm et al. | 381/58 |

FOREIGN PATENT DOCUMENTS

| | | |
|---|---|---|
| EP | 0593228 | 4/1994 |
| EP | 1647909 | 4/2006 |
| EP | 1647909 A2 * | 4/2006 |
| WO | 8602791 | 5/1986 |

OTHER PUBLICATIONS

International Preliminary Report on Patentability dated Jun. 24, 2010 for Application No. PCT/US2008/077628.

International Search Report and Written Opinion dated Mar. 12, 2009 for Application No. PCT/US2008/077628.

Kleiner, et al.; Auralization: Experiments in Acoustical CAD, Chambers University of Technology, Audio Engineering Society 89th Convention, 1990.

Jacob, Kenneth D.; Development of a New Algorithm for Predicting the Speech Intelligibility of Sound Systems, Audio Engineering Society 83rd Convention, 1987.

Jacob, Kenneth D., et al.; Accurate Prediction of Speech Intelligibility without the Use if In-Room Measurements, J. Audio Eng. Soc., vol. 39, No. 4, (Apr. 1991), pp. 232-242.

Jacob, Kenneth D.; Correlation of Speech Intelligibility Tests in Reverberant Rooms with Three Predictive Algorithms, J. Audio Eng. Soc., vol. 37, No. 12, (Dec. 1989), pp. 1020-1030.

(Continued)

*Primary Examiner* — Laura Menz

(74) *Attorney, Agent, or Firm* — Bose Corporation

(57) ABSTRACT

A sound system design/simulation system provides a more realistic simulation of an existing venue by matching a measured reverberation characteristic of the existing venue and adjusting one or more acoustic parameters characterizing the model such that a predicted reverberation characteristic substantially matches the measured reverberation characteristic.

8 Claims, 12 Drawing Sheets

OTHER PUBLICATIONS

Jorgensen, et al.; Judging the Speech Intelligibility of Large Rooms via Computerized Audible Simulations, Audio Engineering Society 91st Convention, 1991.

International Standard, IEC 60268-16, Sound System Equipment, Part 16: Objective Rating of Speech Intelligility bybSpeech Transmission Index, International Electromechanical Commission, Third Edition, 2003.

Houtgast, et al.; Predicting Speech Intelligility in Rooms from the Modulation Transfer Function. I. General Room Acoustics, Acustica, vol. 46, No. 1, (1980), pp. 60-72.

Houtgast, T., et al.; Evaluation of Speech Transmission Channels by Using Artificial Signals, Acustica International Journal on Acoustics, 1971, pp. 355-367, vol. 25, Institute for Perception RVO-TNO, Soesterberg, The Netherlands.

* cited by examiner

| Lock | Material | 31Hz | 63Hz | 125Hz | 250Hz | 500Hz | 1kHz | 2kHz | 4kHz | 8kHz | 16kHz | Area |
|---|---|---|---|---|---|---|---|---|---|---|---|---|
| ☐ | Mineral Board 5/8" ceiling tile | 0.30 | 0.30 | 0.30 | 0.31 | 0.53 | 0.76 | 0.69 | 0.52 | 0.52 | 0.52 | 706.7 |
| ☐ | Carpet - heavy on concrete | 0.02 | 0.02 | 0.02 | 0.06 | 0.14 | 0.37 | 0.60 | 0.65 | 0.65 | 0.65 | 126.4 |
| ☐ | Concrete Block - Painted | 0.10 | 0.10 | 0.10 | 0.05 | 0.06 | 0.07 | 0.09 | 0.08 | 0.08 | 0.08 | 14.0 |
| ☒ | Brick - Bare | 0.03 | 0.03 | 0.03 | 0.03 | 0.03 | 0.04 | 0.05 | 0.07 | 0.07 | 0.07 | 458.4 |
| ☐ | Pews - Wooden | 0.10 | 0.10 | 0.10 | 0.09 | 0.08 | 0.08 | 0.08 | 0.08 | 0.08 | 0.08 | 336.0 |

SYSTEM AND METHOD FOR SOUND SYSTEM SIMULATION

BACKGROUND

This disclosure relates to systems and methods for sound system design and simulation. As used herein, design system and simulation system are used interchangeably and refer to systems that allow a user to build a model of at least a portion of a venue, arrange sound system components around or within the venue, and calculate one or more measures characterizing an audio signal generated by the sound system components. The design system or simulation system may also simulate the audio signal generated by the sound system components thereby allowing the user to hear the audio simulation.

SUMMARY

A sound system design/simulation system provides a more realistic simulation of an existing venue by matching a measured reverberation characteristic of the existing venue and adjusting one or more acoustic parameters characterizing the model such that a predicted reverberation characteristic substantially matches the measured reverberation characteristic.

One embodiment of the present invention is directed to an audio simulation system comprising: a model manager configured to enable a user to build a 3-dimensional model of a venue and place and aim one or more loudspeakers in the model; a user interface configured to associate a material with a surface in the 3-dimensional model and to receive at least one measured reverberation time value; an audio engine configured to adjust an absorption coefficient of the material such that a predicted reverberation time value matches the at least one measured RT value; and an audio player generating at least two acoustic signals simulating an audio program played over the one or more loudspeakers in the model, the simulated audio program based on the adjusted absorption coefficient. In an aspect, the predicted reverberation time value matches the at least one measured reverberation time value to within 0.5 seconds. In another aspect, the predicted reverberation time value matches the at least one measured reverberation time value to within 0.05 seconds. In another aspect, each material is characterized by an index and adjusted according to its index. In a further aspect, the index is a product of a surface area associated with the material and a reflection coefficient of the material. In a further aspect, the absorption coefficient of the material is adjusted according to a surface area associated with the material. In a further aspect, the absorption coefficient of the material is adjusted according to a reflection coefficient of the material. In another aspect, the at least one measured reverberation time value is an RT60 value.

Another embodiment of the present invention is directed to an audio simulation method comprising: providing an audio simulation system including a model manager, an audio engine, and an audio player; receiving at least one measured reverberation time; and matching a predicted reverberation time to the at least one measured reverberation time. In an aspect, the predicted reverberation time is within 0.5 seconds of the measured reverberation time. In another aspect, the predicted reverberation time is within 0.1 seconds of the measured reverberation time. In another aspect, an absolute value of a difference between the predicted reverberation time and the measured reverberation time is less than about 0.05 seconds. In another aspect, the step of matching further comprises adjusting a material characteristic such that the predicted reverberation time matches the at least one measured reverberation time. In a further aspect, the material characteristic is an absorption coefficient of a material. In a further aspect, the absorption coefficient of a material is adjusted according to a prioritized list of materials, each material in the prioritized list characterized by an index. In another aspect, the index is proportional to a product of a surface area of the material and a reflection coefficient of the material.

Another embodiment of the present invention is directed to an audio simulation system comprising: a user interface configured to receive at least one measured reverberation time of a venue; an audio engine configured to predict a reverberation time of the venue based on at least one absorption coefficient of a material associated with a surface of the venue; means for adjusting the at least one absorption coefficient such that the predicted reverberation time matches the at least one measured reverberation time; and an audio player generating at least two acoustic signals simulating an audio program played in the venue, the simulated audio program based on the at least one absorption coefficient.

Another embodiment of the present invention is directed to a computer-readable medium storing computer-executable instructions for performing a method comprising: providing an audio simulation system including a model manager, an audio engine, and an audio player; receiving at least one measured reverberation time of a venue; and adjusting an absorption coefficient of a material associated with a surface of the venue such that a predicted reverberation time based on the adjusted absorption coefficient matches the at least one measured reverberation time.

DETAILED DESCRIPTION

Figure 1:
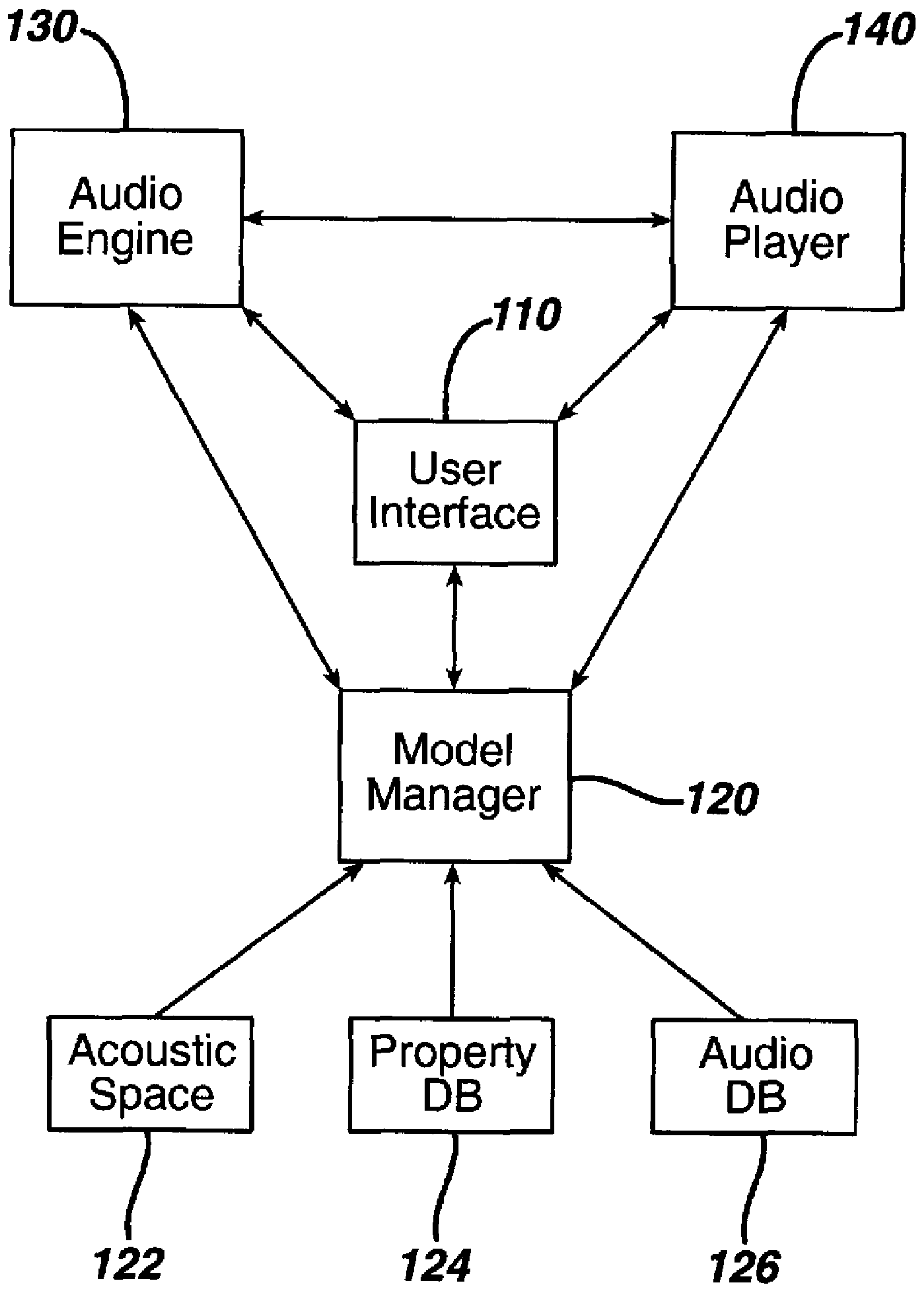
FIG. 1 is a diagram illustrating an architecture for an interactive sound system design system.

FIG. 1 illustrates an architecture for an interactive sound system design system. The design system includes a user interface 110, a model manager 120, an audio engine 130 and an audio player 140. The model manager 120 enables the user to build a 3-dimensional model of a venue, select venue surface materials, and place and aim one or more loudspeakers in the model. A property database 124 stores the acoustic properties of materials that may be used in the construction of the venue. An audio database 126 stores the acoustic properties of loudspeakers and other audio components that may be used as part of the designed sound system. Variables characterizing the venue or the acoustic space 122 such as, for example, temperature, humidity, background noise, and percent occupancy may be stored by the model manager 120.

The audio engine 130 estimates one or more sound qualities or sound measures of the venue based on the acoustic model of the venue managed by the model manager 120 and the placement of the audio components. The audio engine 130 may estimate the direct and/or indirect sound field coverage at any location in the venue and may generate one or more sound measures characterizing the modeled venue using methods and measures known in the acoustic arts.

The audio player 140 generates at least two acoustic signals that preferably give the user a realistic simulation of the designed sound system in the actual venue. The user may select an audio program that the audio player uses as a source input for generating the at least two acoustic signals that simulate what a listener in the venue would hear. The at least two acoustic signals may be generated by the audio player by filtering the selected audio program according to the predicted direct and reverberant characteristics of the modeled venue predicted by the audio engine. The audio player 140 allows the designer to hear how an audio program would sound in the venue, preferably before construction of the venue begins. This allows the designer to make changes to the selection of materials and/or surfaces during the initial design phase of the venue where changes can be implemented at low cost relative to the cost of retrofitting these same changes after construction of the venue. The auralization of the modeled venue provided by the audio player also enables the client and designer to hear the effects of different sound systems in the venue and allows the client to justify, for example, a more expensive sound system when there is an audible difference between sound systems. An example of an audio player is described in U.S. Pat. No. 5,812,676 issued Sep. 22, 1998, herein incorporated by reference in its entirety.

Examples of interactive sound system design systems are described in co-pending U.S. patent application Ser. No. 10/964,421 filed Oct. 13, 2004, herein incorporated by reference in its entirety. Procedures and methods used by the audio engine to calculate coverage, speech intelligibility, etc., may be found in, for example, K. Jacob et al., "*Accurate Prediction of Speech Intelligibility without the Use of In-Room Measurements*," J. Audio Eng. Soc., Vol. 39, No. 4, pp. 232-242 (April, 1991) and are herein incorporated by reference in their entirety. Auralization methods implemented by the audio player may be found in, for example, M. Kleiner et al., "*Auralization: Experiments in Acoustical CAD*," Audio Engineering Society Preprint # 2990, September, 1990 and is herein incorporated by reference in its entirety.

Figure 2:
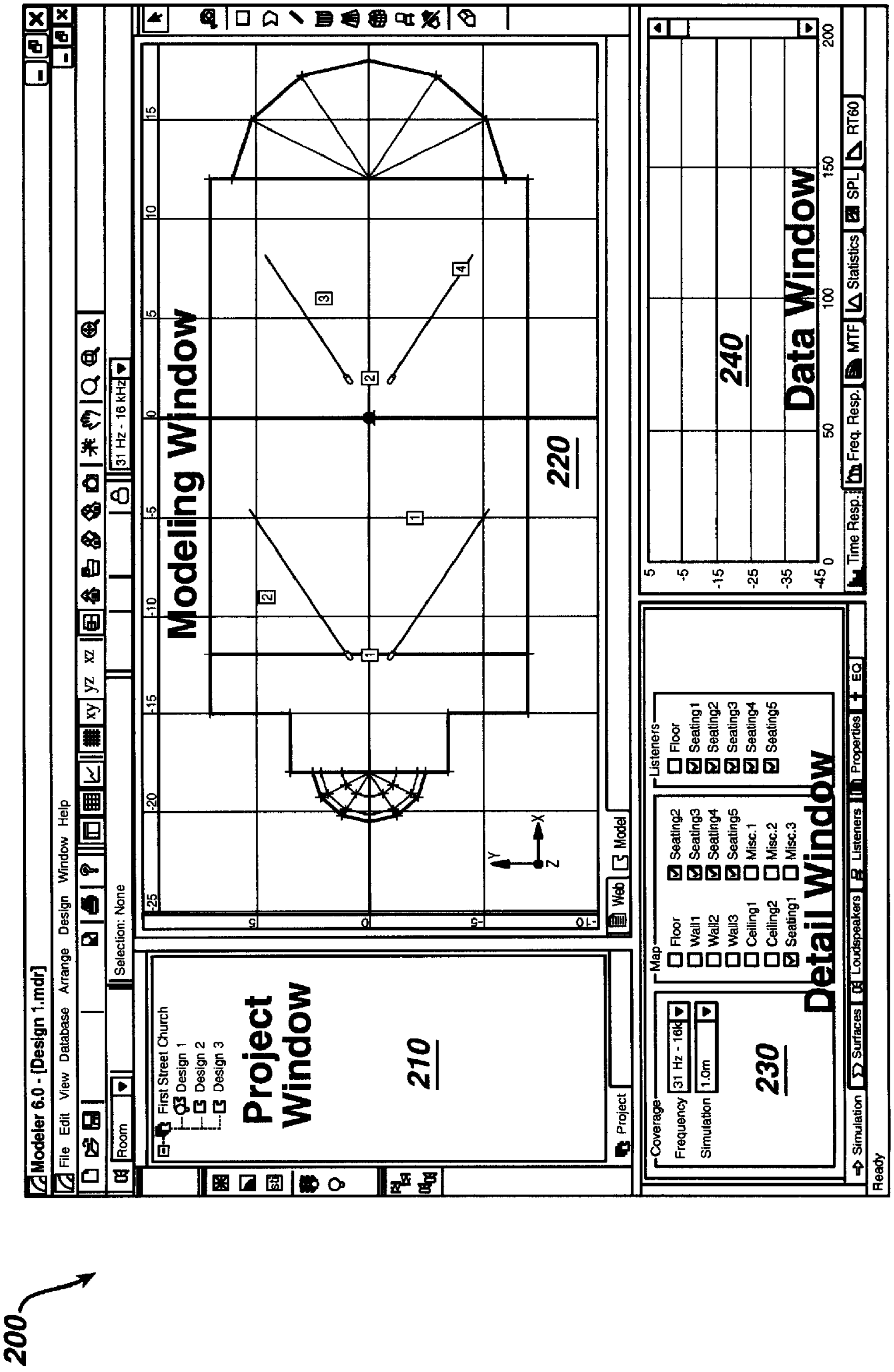
FIG. 2 illustrates a display portion of a user interface of the system shown in FIG. 1.

FIG. 2 illustrates a display portion of a user interface of the system shown in FIG. 1. In FIG. 2, the display 200 shows a project window 210, a modeling window 220, a detail window 230, and a data window 240. The project window 210 may be used to open existing design projects or start a new design project. The project window 210 may be closed to expand the modeling window 220 after a project is opened.

The modeling window 220, detail window 230, and the data window 240 simultaneously present different aspects of the design project to the user and are linked such that data changed in one window is automatically reflected in changes in the other windows. Each window can display different views characterizing an aspect of the project. The user can select a specific view by selecting a tab control associated with the specific view.

Figure 3:
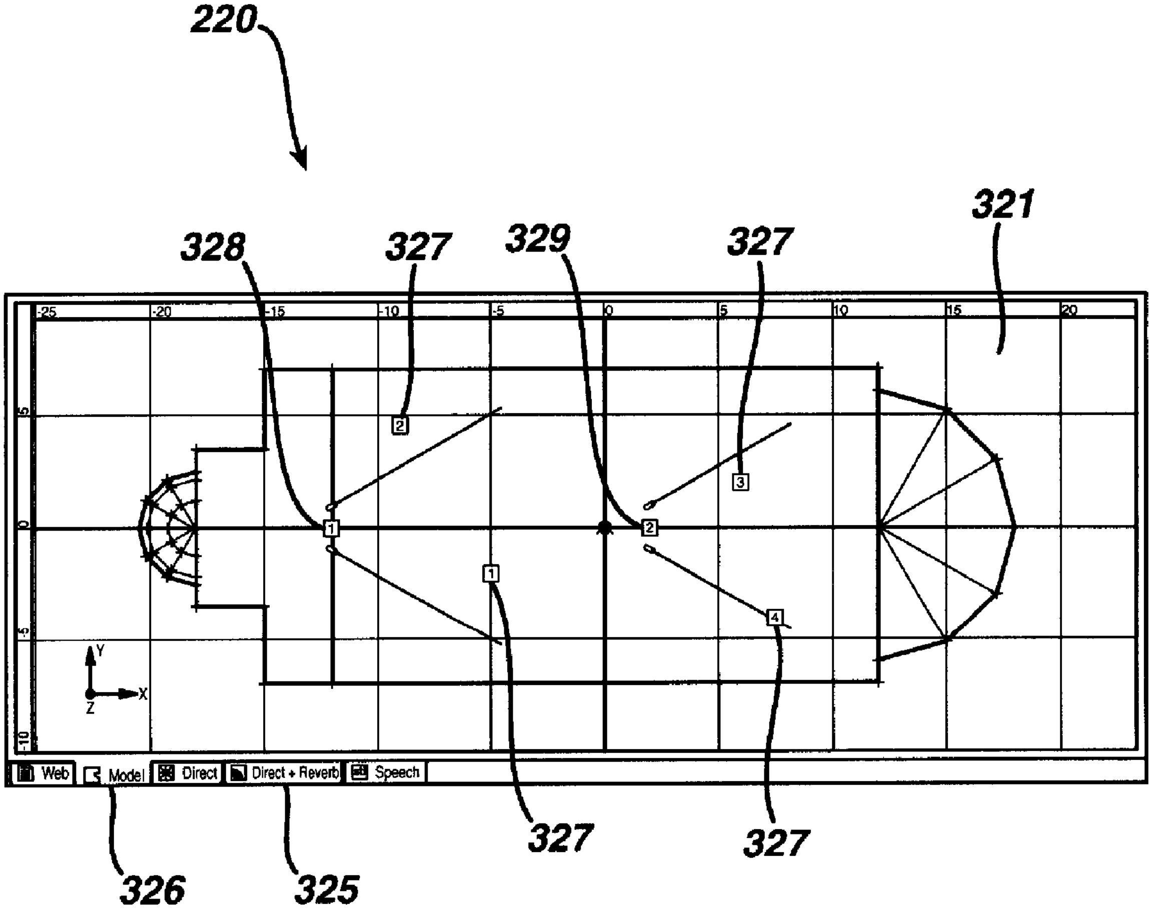
FIG. 3 illustrates a detailed view of a modeling window in the display portion of FIG. 2.

FIG. 3 illustrates an exemplar modeling window 220. In FIG. 3, control tabs 325 may include a Web tab, a Model tab, a Direct tab, a Direct+Reverb tab, and a Speech tab. The Web tab provides a portal for the user to access the Web to, for example, access plug-in software components or download updates from the Web. The Model tab enables the user to build and view a model. The model may be displayed in a 3-dimensional perspective view that can be rotated by the user. In FIG. 3, the model tab 326 has been selected and displays the model in a plan view in a display area 321 and shows the locations of user selectable speakers 328, 329 and listeners 327.

The Direct, Direct+Reverb, and Speech tabs estimate and display coverage patterns for the direct field, the direct+reverb field, and a speech intelligibility field. The coverage area may be selected by the user. The coverage patterns are preferably overlaid over a portion of the displayed model. The coverage patterns may be color-coded to indicate high and low areas of coverage or the uniformity of coverage. The direct field is estimated based on the SPL at a location generated by the direct signal from each of the speakers in the modeled venue. The direct+reverb field is estimated based on the SPL at a location generated by both the direct signal and the reflected signals from each of the speakers in the modeled venue. A statistical model of reverberation may be used to model the higher order reflections and may be incorporated into the estimated direct+reverb field. The speech intelligibility field displays the speech transmission index (STI) over the portion of the displayed model. The STI is described in K. D. Jacob et al., "Accurate Prediction of Speech Intelligibility without the Use of In-Room Measurements," J. Audio Eng. Soc., Vol. 39, No. 4, pp 232-242 (April, 1991), Houtgast, T. and Steeneken, H. J. M. "Evaluation of Speech Transmission Channels by Using Artificial Signals" Acoustica, Vol. 25, pp 355-367 (1971), "Predicting Speech Intelligibility in Rooms from the Modulation Transfer Function. I. General Room Acoustics," Acoustica, Vol. 46, pp 60-72 (1980) and the international standard "Sound System Equipment—Part 16: Objective Rating of Speech Intelligibility by Speech Transmission Index, IEC 60268-16, which are each incorporated herein in their entirety.

Figure 4:
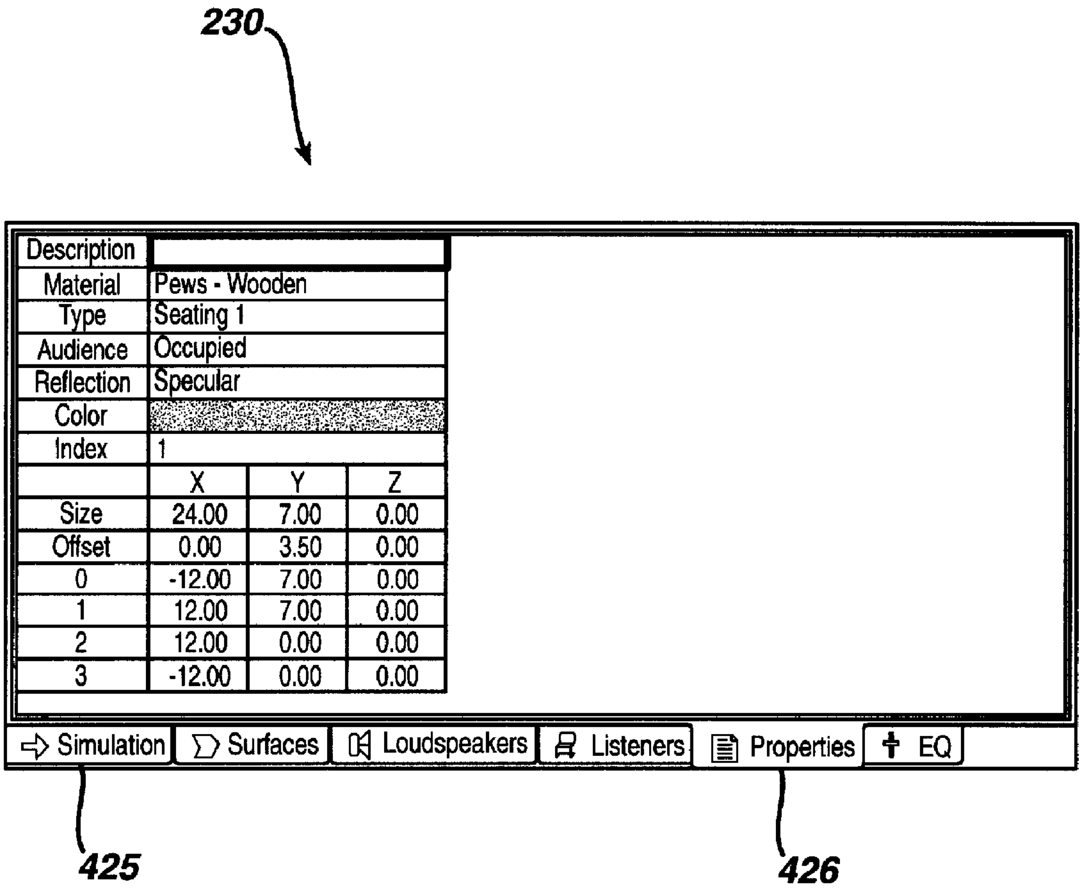
FIG. 4 illustrates a detailed view of a detail window in the display portion of FIG. 2.

FIG. 4 shows an exemplar detail window 230. In FIG. 4, the property tab 426 is shown selected. Other control tabs 425 may include a Simulation tab, a Surfaces tab, a Loudspeakers tab, a Listeners tab, and an EQ tab.

When the Simulation tab is selected, the detail window display one or more input controls that allow the user to specify a value or select from a list of values for a simulation parameter. Examples of simulation parameter include a frequency or frequency range encompassed by the coverage map, a resolution characterizing the granularity of the coverage map, and a bandwidth displayed in the coverage map. The user may also specify one or more surfaces in the model for display of the acoustic prediction data.

The Surfaces, Loudspeakers, and Listeners tab allows the user to view the properties of the surfaces, loudspeakers, and listeners, respectively, placed in the model and allows the user to quickly change one or more parameters characterizing a surface, loudspeaker or listener. The Properties tab allows the user to quickly view, edit, and modify a parameter characterizing an element such as a surface or loudspeaker in the model. A user may select an element in the modeling window and have the parameter values associated with that element displayed in the detail window. Any change made by the user in the detail window is reflected in an updated coverage map, for example, in the modeling window.

When selected, the EQ tab enables the user to specify an equalization curve for one or more selected loudspeakers. Each loudspeaker may have a different equalization curve assigned to the loudspeaker.

Figure 5:
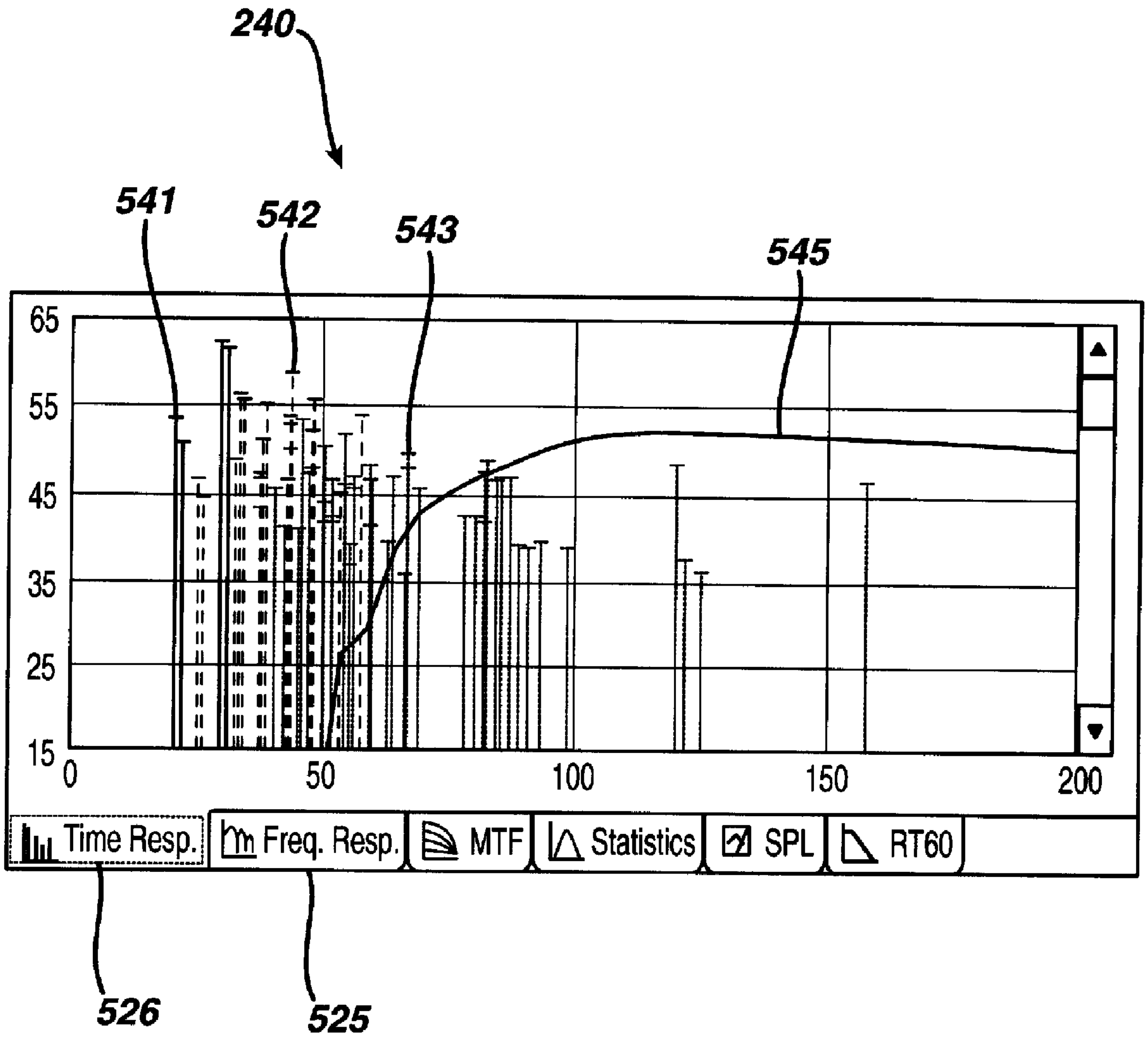
FIG. 5 illustrates a detailed view of a data window in the display portion of FIG. 2.

FIG. 5 shows an exemplar data window 240 with a Time Response tab 526 selected. Other control tabs 525 may include a Frequency Response tab, a Modulation Transfer Function (MTF) tab, a Statistics tab, a Sound Pressure Level (SPL) tab, and a Reverberation Time (RT60) tab. The Frequency Response tab displays the frequency response at a particular location selected by the user. The user may position a sample cursor in the coverage map displayed in the modeling window 220 and the frequency response at that location is displayed in the data window 240. The MTF tab displays a normalized amount of modulation preserved as a function of the frequency at a particular location selected by the user. The Statistics tab displays a histogram indicating the uniformity of the coverage data in the selected coverage map. The histogram preferably plots a normalized occurrence of a particular SPL against the SPL value. The mean and standard deviations may be displayed on the histogram as color-coded lines. The SPL tab displays the room frequency response as a function of frequency. A color-coded line representing the mean SPL at each frequency may be displayed in the data window along with color-coded lines representing a background noise level and/or a house curve, which represents the desired room frequency response. A shaded band may surround the mean SPL line to indicate a standard deviation from the mean. The RT60 tab displays the reverberation time as a function of frequency. The reverberation time is typically the RT60 time although other measures characterizing the reverberation decay may be used. The RT60 time is defined as the time required for the reverberation to exponentially decay by 60 dB. The user may choose to display the average absorption data as a function of frequency instead of the reverberation time.

In FIG. 5, a time response plot is displayed in the data window 240. The time response plot shows a signal strength or SPL along the vertical axis, the elapsed time on the horizontal axis and indicates the arrival of acoustic signals at a user-selected location. The vertical spikes or pins shown in FIG. 5 represent an arrival of a signal at a sampling location from one of the loudspeakers in the design. The arrival may be a direct arrival 541 or an indirect arrival that has been reflected from one or more surfaces in the model. In a preferred embodiment, each pin may be color-coded to indicate a direct arrival, a first order arrival representing a signal that has been reflected from a single surface 542, a second order arrival representing a signal that has been reflected from two surfaces 543, and higher order arrivals. A reverberant field envelope 545 may be estimated and displayed in the time response plot. An example of how the reverberant field envelope may be estimated is described in K. D. Jacob, "*Development of a New Algorithm for Predicting the Speech Intelligibility of Sound Systems*," presented at the $83^{rd}$ Convention of the Audio Engineering Society, New York, N.Y. (1987) and is incorporated herein in its entirety.

A user may select a pin shown in FIG. 5 and have the path of the selected pin displayed in the modeling window 220. The user may then make a modification to the design in the detail window 240 and see how the modification affects the coverage displayed in the modeling window 220 or how the modification affects a response in the data window. For example, a user can quickly and easily adjust a delay for a loudspeaker using a concurrent display of the modeling window 220, the data window 240, and the detail window 230. In this example, the user may adjust the delay for a loudspeaker to provide the correct localization for a listener located at the sample position. Listeners tend to localize sound based on the first arrival that they hear. If the listener is positioned closer to a second loudspeaker located farther away from an audio source than a first loudspeaker, they will tend to localize the source to the second loudspeaker and not to the audio source. If the second loudspeaker is delayed such that the audio signal from the second loudspeaker arrives after the audio signal from the first loudspeaker, the listener will be able to properly localize the sound.

The user can select the proper delays by displaying in the data window the direct arrivals in the time response plot. The user can select a pin representing one of the direct arrivals to identify the source of the selected direct arrival in the modeling window, which displays the path of the selected direct arrival from one of the loudspeakers in the model. The user can then adjust the delay of the identified loudspeaker in the detail window such than the first direct arrival the listener hears is from the loudspeaker closest to the audio source.

The concurrent display of both the model and coverage field in the modeling window, a response characteristic such as time response in the data window, and a property characteristic such as loudspeaker parameters in the detail window enables the user to quickly identify a potential problem, try various fixes, see the result of these fixes, and select the desired fix.

Removing objectionable time arrivals is another example where the concurrent display of the model, response, and property characteristics enables the user to quickly identify and correct a potential problem. Generally, arrivals that arrive more than 100 ms after the direct arrival and are more than 10 dB above the reverberant field may be noticed by the listener and may be unpleasant to the listener. The user can select an objectionable time arrival from the time response plot in the data window and see the path in the modeling window to identify the loudspeaker and surfaces associated with the selected path. The user can select one of the surfaces associated with the selected path and modify or change the material associated with the selected surface in the detail window and see the effect in the data window. The user may re-orient the loudspeaker by selecting the loudspeaker tab in the detail window and entering the changes in the detail window or the user may move the loudspeaker to a new location by dragging and dropping the loudspeaker in the modeling window.

Figure 6A:
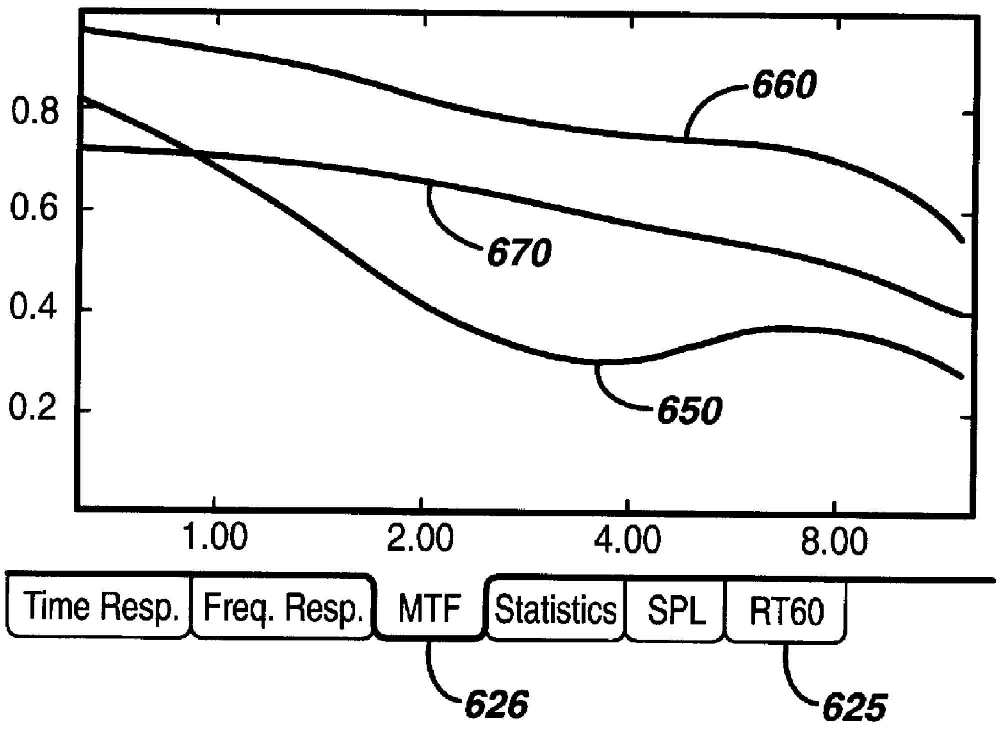
FIG. 6*a* illustrates a detailed view of the data window with an MTF tab selected.

FIG. 6a shows the data window with the MTF tab 626 selected. The Modulation Transfer Function (MTF) returns a normalized modulation preserved as a function of modulation frequency for a given octave band. A discussion of the MTF is presented in K. D. Jacob, "Development of a New Algorithm for Predicting the Speech Intelligibility of Sound Systems," presented at the $83^{rd}$ Convention of the Audio Engineering Society, New York, N.Y. (1987), Houtgast, T. and Steeneken, H. J. M. "Evaluation of Speech Transmission Channels by Using Artificial Signals" Acoustica, Vol. 25, pp 355-367 (1971) and "Predicting Speech Intelligibility in Rooms from the Modulation Transfer Function. I. General Room Acoustics," Acoustica, Vol. 46, pp 60-72 (1980), and the international standard "Sound System Equipment—Part 16: Objective Rating of Speech Intelligibility by Speech Transmission Index, IEC 60268-16, which are each incorporated herein in their entirety. In FIG. 6, the MTF for octave bands corresponding to 125 Hz 650, 1 kHz 660, and 8 kHz 670 are shown for clarity although other octave bands may be displayed. In an ideal situation, a MTF substantially equal to one indicates that modulation of the voice box of a human speaker generating the speech is substantially preserved and therefore the speech intelligibility should be ideal. In a real-world situation, however, the MTF may drop significantly below the ideal and indicate possible speech intelligibility problems.

Figure 6B:
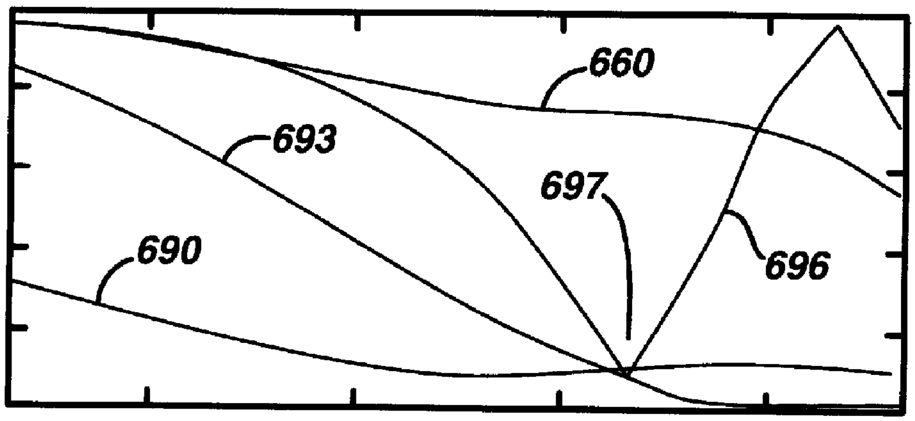
FIG. 6*b* displays exemplar MTF plots indicative of typical speech intelligibility problems.

FIG. 6*b* displays exemplar MTF plots that may indicate the source of a speech intelligibility problem. In FIG. 6*b*, the MTF corresponding to the 1 kHz MTF 660 shown in FIG. 6*a* is re-displayed to provide a comparison to the other MTF plots. The MTF labeled 690 in FIG. 6*b* illustrates an MTF that may be expected if background noise significantly affects the speech intelligibility of the modeled space. When background noise is a significant contributor to poor speech intelligibility, the MTF is significantly reduced independent of the modulation frequency as illustrated in FIG. 6*b* by comparing the MTF labeled 690 to the MTF labeled 660. When reverberation is a significant contributor to poor speech intelligibility, the MTF is reduced at higher modulation frequencies where the rate of reduction of the MTF increases as the reverberation times increase as illustrated by the MTF labeled 693 in FIG. 6*b*. The MTF labeled 696 in FIG. 6*b* illustrates an effect of late-arriving reflections on the MTF. A late-arriving reflection is manifested in the MTF by a notch 697 located at a modulation frequency that is inversely proportional to the time delay of the late-arriving reflection.

As FIG. 6*b* illustrates, reverberation can have a significant impact on the speech intelligibility of a venue. More importantly, listeners can distinguish very slight differences in reverberation that cannot be predicted using current ab initio simulation tools. Current sound system design-only systems can adequately predict sound coverage patterns or speech intelligibility coverage patterns for a modeled venue and sound system. These coverage patterns, however, are fairly coarse relative to the human ear and cannot give the listener a realistic simulation of the modeled venue. In such a situation, the simulation of the modeled venue that the user experiences may be substantially different from what the user experiences when in the actual venue. The difference may be an unpleasant surprise to the listener who assumed that the simulation of the modeled venue was accurate and would closely match the experience in the actual venue. If the venue has not been built, the venue may still be modeled and a range of reverberation times provided. In this way, the user may still listen to a range of reverberation times and gain an appreciation of a range of possible listening experiences of the venue.

In many situations, the modeled venue may already exist and measured reverberation times for the existing venue may be available to the modeler. In such situations, the modeler may enter the measured reverberation times for the existing venue into the simulation system and have the system automatically adjust the model to match the measured reverberation times. The adjusted model generates a simulation that more closely matches what the user would experience in the existing venue and allows the user to make a more precise evaluation of the modeled sound system.

The reverberation characteristics of a venue may be viewed as having three regimes: an early reflections period, an early reverberant field period, and a late decaying tail period. The reverberant characteristics of the early reflections period are generally determined by characteristics such as the locations of audio sources, geometry of the venue, acoustic absorption of the venue surfaces, and the location of the listener. The reverberant characteristics of the early reverberant field period are generally determined by characteristics such as the scattering surfaces of the venue. The reverberant characteristics of the late decaying tail period are substantially determined by a reverberation time, RT, characterizing an exponential decay. An example of a reverberation time characteristic is the RT60 time, which is the time it takes the reverberation in the late decaying tail period to decay by 60 db. Other measures of the reverberation characteristic of the late decaying tail period may be used following the teachings described herein. The reverberation time, RT60, may be estimated from the absorption coefficient and area of each surface characterizing the venue using, for example, the Sabine equation.

The inventors have discovered that a listener is typically more sensitive to the reverberant characteristics of the late decaying tail period than the reverberant characteristics of the early reflections or early reverberant field periods. Matching a predicted reverberation time to a measured reverberation time gives the listener a more realistic simulation of the venue. Matching of the predicted reverberation time to the measured reverberation time may be accomplished by adjusting the acoustic absorption coefficient, hereinafter referred to as the absorption coefficient, of one or more surfaces of the modeled venue. The absorption coefficient is adjusted such that the predicted reverberation time value for the late decaying tail period matches the measured reverberation time value of the venue such that the difference between the predicted reverberation time value and measured reverberation time value is barely perceived, if at all, by the listener.

The absorption coefficient of a material may be frequency dependent. The audio spectrum is preferably discretized into one or more frequency bands and a predicted reverberation time value for each band is estimated using the absorption coefficient values corresponding to the associated band. Adjusting the absorption coefficients of the materials in the venue to match the reverberation time values also affects the reverberation characteristics of the early reflections and/or early reverberant field periods. The inventors have discovered, however, that adjustments to the absorption coefficient of the materials may be done such that the differences in the reverberation characteristics of the early reflections and early reverberant field periods arising from the adjustments are typically not noticeable by the listener.

In some embodiments, adjustments to the absorption coefficients are determined by a prioritized list of materials that are ranked according to a surface-area-weighted reflection coefficient. For example, the materials may be ranked according to an index, $\epsilon(i,j)=A(i)(1-\alpha(i,j))$, where $\epsilon(i,j)$ is the index for the i-th surface in the j-th frequency band, A(i) is the surface area of the i-th surface, $\alpha(i,j)$ is the absorption coefficient for the i-th surface in the j-th frequency band, and $(1-\alpha(i,j))$ is a reflection coefficient for the i-th surface in the j-th frequency band. The modeled venue may contain one or more surfaces associated with the same material and to rank the materials, the total surface area associated with each material is used to calculate the index, $\epsilon$.

If a diffuse sound field is assumed, the surface area associated with the m-th material is the sum of surface areas associated with the m-th material. If a ray tracing method is used to predict a portion of the reverberation, the surface area associated with the m-th material is weighted according to the number of ray impingements on the m-th surface and is given by the equation:

$$A(m) = Atot\frac{\sum n(i)}{ntot} \tag{1}$$

where A(m) is the total surface area associated with the m-th material, Atot is the total surface area of the venue, n(i) is the number of impingements on the i-th surface and the sum is taken over all surfaces associated with the m-th material, and ntot is the total number of ray impingements.

Adjustments to the absorption coefficient of the materials on the prioritized list are made according to the index of each material. The material with the largest index is adjusted first and if the adjustment to that material is sufficient to match the predicted reverberation time value to the measured reverberation time value, the remaining materials on the prioritized list are not adjusted. The magnitude of the adjustment may be limited by a pre-determined maximum adjustment value, MAV. If the material with the largest index is adjusted by the MAV and the reverberation time values still do not match, the material with the next largest index is adjusted up to its MAV and if the reverberation time values still do not match, the material with the next largest index is adjusted and so on until all the materials in the prioritized list have been adjusted by their respective MAV. If all the materials in the prioritized list have been adjusted by the MAV and the RT values still do not match, the system may alert the user to the mismatch and ask the user to allow an increase in the MAV. In some embodiments, the MAV is selected to limit a change in the sound pressure level of a sound wave reflected by the surface. The MAV may be determined by the equation:

$$MAV=(1-10^{MaxDelta/10})(1-\alpha(i,j)) \quad (2)$$

where MaxDelta is maximum change in the SPL of the reflected wave and α(i,j) is the absorption coefficient for the i-th surface in the j-th frequency band. MaxDelta may be set to a value in a closed range of 0.01 to 2 dB, preferably in a closed range of 0.1 to 1 dB, and more preferably in a closed range of 0.25 to 1 dB. The adjusted absorption coefficient may be clipped to ensure that the absorption coefficient is within the closed range of zero to one.

A ranking based on the index described above enables the system to use the smallest adjustment to the absorption coefficient to match the reverberation time values while reducing the effects on the early reflections and early reverberant field periods arising from the adjustment to the absorption coefficient. Selecting a material having the largest surface area generally has the greatest effect on the reverberation time but also tends to affect the early reflection patterns from the material's surfaces. The change in the early reflection patterns may be reduced by selecting a surface with the lowest absorption coefficient or equivalently the highest reflection coefficient.

Use of the prioritized list is not required, however, and other methods of adjusting the absorption coefficients may be used as long as the alterations generated in the early reflections and early reverberant field periods caused by the reverberation time matching are not perceptible by the user.

Figure 7:
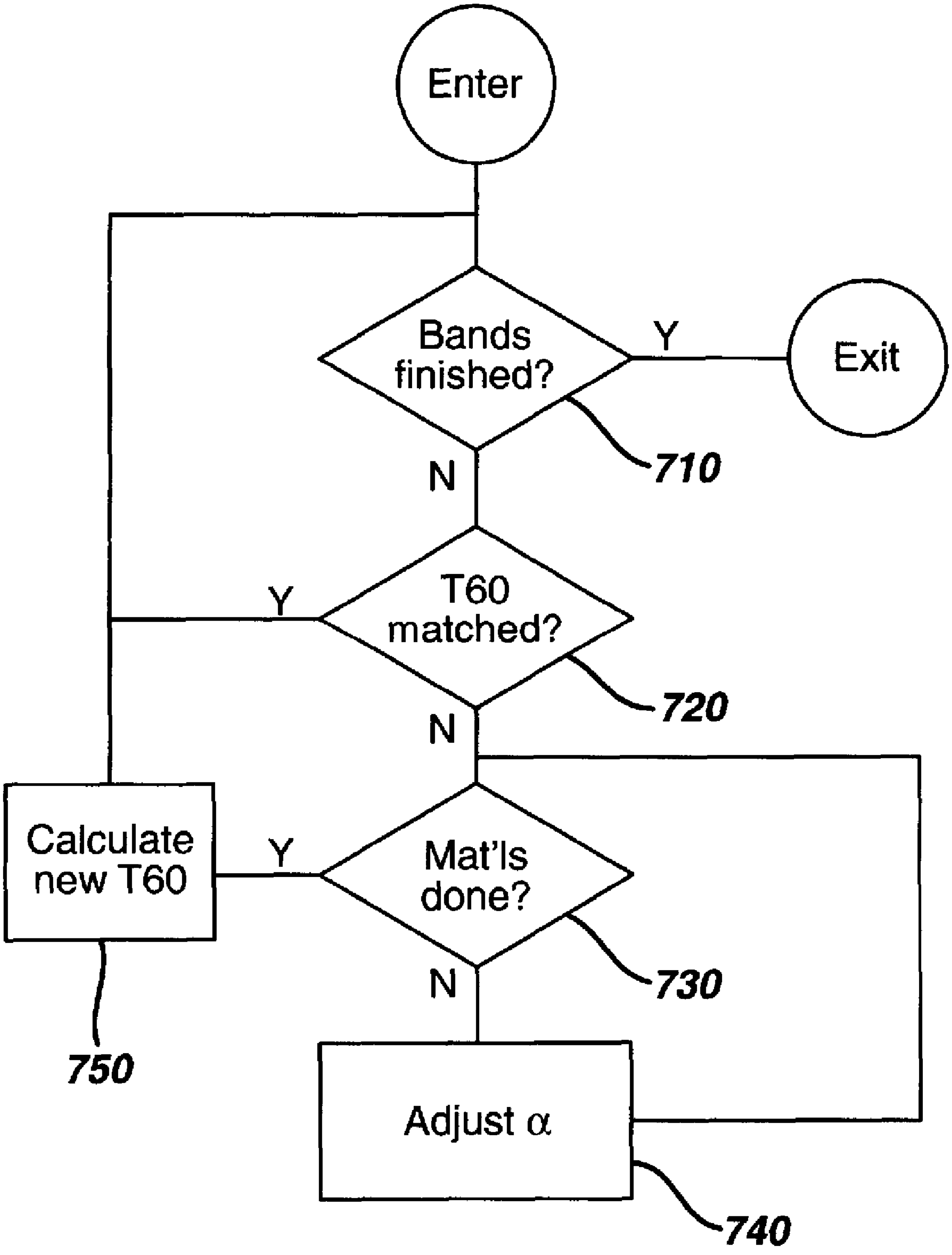
FIG. 7 is a flowchart illustrating a reverberation matching process.

FIG. 7 is a flowchart illustrating an exemplar process for matching predicted reverberation times to measured reverberation times. The audio spectrum is discretized into one or more frequency bands and the reverberation time is individually matched within each frequency band. The width of the frequency band may be selected by the user depending on a desired accuracy or on the available material data and preferably is between three octaves and one-tenth octave and more preferably is within a closed range of one octave to one-third octave wide. After the reverberation time for each band has been matched, the process exits as shown in step 710.

Within each band, the predicted reverberation time for that band is compared to the measured reverberation time for that band. The reverberation times are considered matched if the absolute value of the difference between the predicted reverberation time and the measured reverberation time is less than or equal to a pre-defined value. In other words, the reverberation times are considered matched when the predicted reverberation time is within a pre-defined value of the measured reverberation time. The process proceeds to the next frequency band, as indicated in step 720. The pre-defined value may be a user-defined value or a system-defined constant based on, for example, psycho-acoustic data. The pre-defined value may be selected such that the difference between the predicted and measured reverberation times is not perceptible by a listener. For example, the pre-defined value may be less than 0.5 seconds, preferably less than 0.1 seconds, and more preferably less than or equal to about 0.05 seconds.

If the difference between the predicted and measured reverberation time values is greater than the pre-defined value, the absorption coefficient, α, of one or more materials may be adjusted such that the predicted reverberation time value matches the measured reverberation time value, as indicated in step 740. In some embodiments, the magnitude of an adjustment, δα, may be limited by a pre-defined maximum adjustment value, MAV, to limit the change to a material's α and to apportion the required adjustment over all the materials, if necessary. If the maximum allowed adjustment to the first material is not sufficient to match reverberation time values, the α of the second material is adjusted, and so on until the α of all the materials have been adjusted by its MAV, as indicated in step 730.

A new predicted reverberation time value is estimated based on the adjusted a of the materials in 750. The predicted reverberation time value is given by Sabine's equation:

$$RT(j) = \frac{0.16V}{\sum_i A(i)\alpha(i, j) + A'\delta\alpha'(j)} \quad (3)$$

where RT(j) is the predicted reverberation time for the j-th frequency band, V is the volume in cubic meters, A(i) is the surface area, in square meters, of the i-th surface, α(i,j) is the absorption coefficient of the i-th surface of the j-th frequency band, A' is the surface area, in square meters, of the selected surface, and δα'(j) is the change in absorption coefficient in the j-th frequency band of the material associated with the selected surface. Absorption coefficients may be modified to account for various occupancy levels of the modeled venue. For example, an absorption coefficient for a floor surface where the audience may sit may be modified depending on whether the surface is partially or fully covered by the audience or is empty.

If the new reverberation time value still does not match the measured reverberation time value after all the materials have been adjusted by their maximum allowed adjustment, the remaining difference is displayed to the user, and the user is presented with an option to repeat the process shown in FIG. 7 with a larger MAV. If the user selects this option, the process is repeated for bands that still have mismatched reverberation time values but with a larger MAV.

Figure 8:
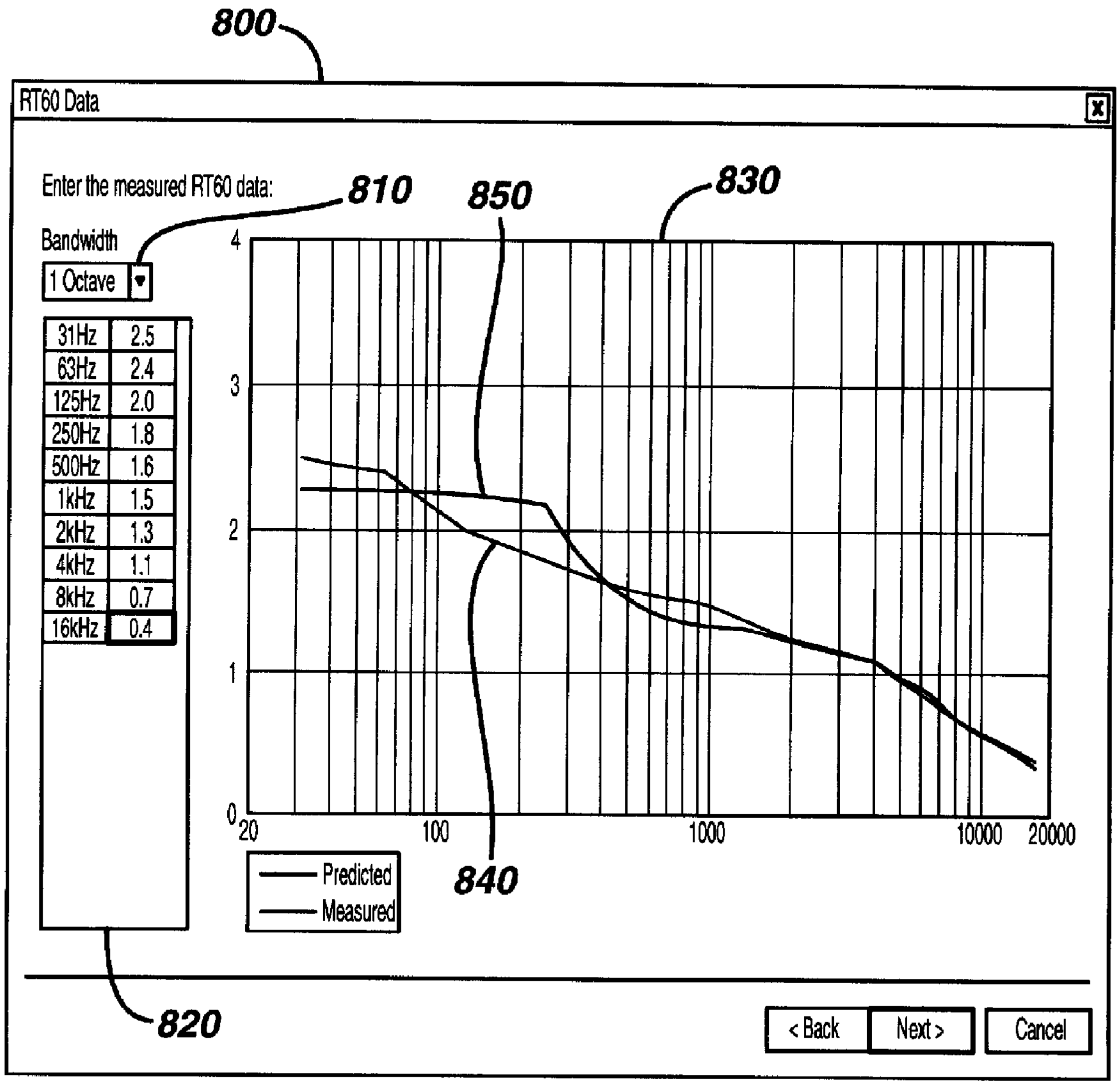
FIG. 8 illustrates a data window prior to the matching process of FIG. 7.

FIG. 8 illustrates a window that may be displayed to the user to show the status of the reverberation time matching process. In some embodiments, a wizard may be used to guide the user through the matching process. The window 800 includes a list box 820 displaying the reverberation time for each frequency band, a list control box 810 that allows the user to select a frequency width for the matching process. In the example shown in FIG. 8, the user has selected a one octave frequency band and has entered the measured reverberation time values for each octave band in the list box 820.

The window 800 includes a plot area 830 where the measured and predicted reverberation time values are displayed as a function of frequency, as indicated by lines 840 and 850, respectively. The plots of the measured and predicted reverberation time values allow the user to quickly see the mismatches between the measured and predicted reverberation time values.

Figure 9:
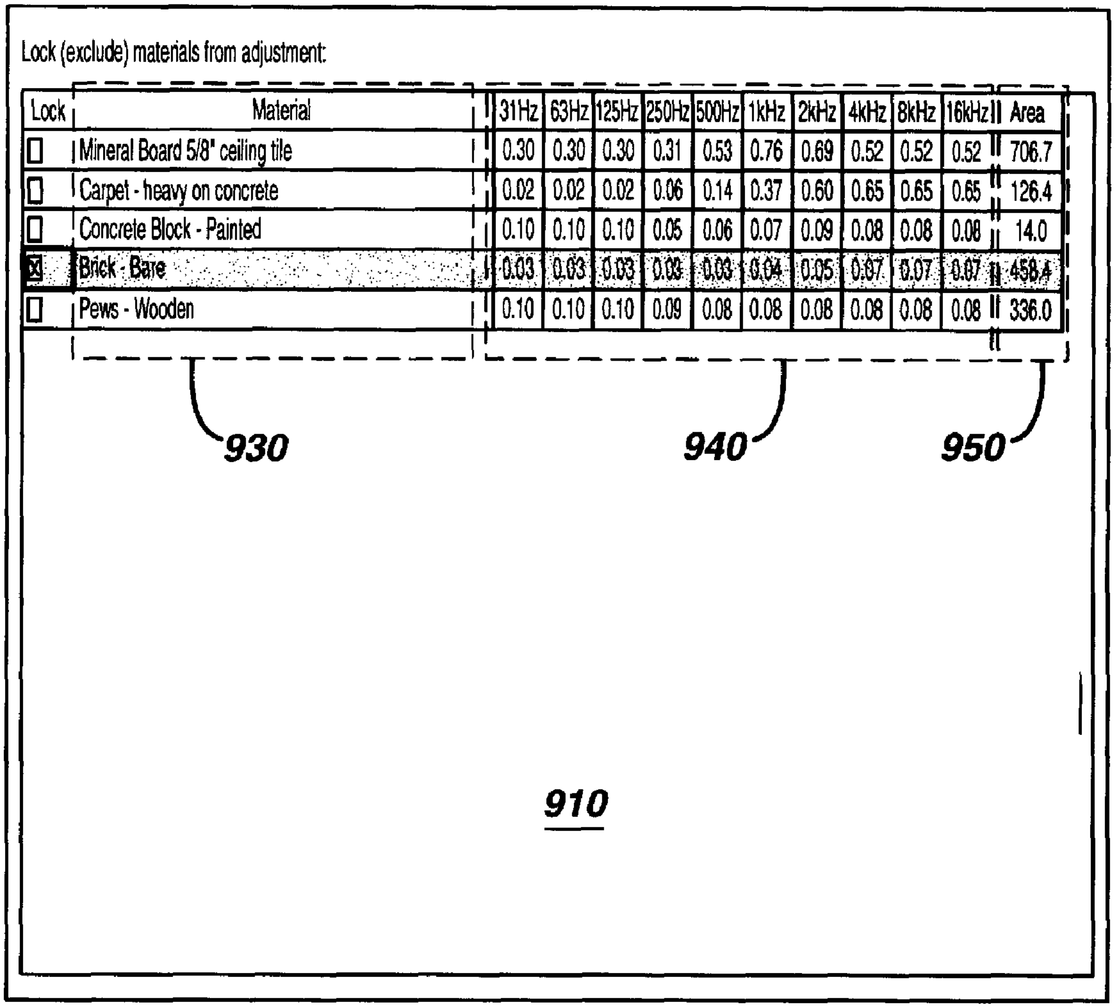
FIG. 9 illustrates another data window prior to the matching process of FIG. 7.

When the user selects the next button in window 800, the wizard displays a list of materials associated with the surfaces in the modeled venue as shown, for example, in FIG. 9. In FIG. 9, a table 910 is displayed listing each material 930, the absorption coefficient for the material at each frequency band 940, and the total surface area of each material in the modeled venue 950. A check box 920 next to each material allows the user to lock the absorption coefficients for that material. If the material is locked, the absorption coefficients for the locked material are not adjusted during the matching process. A user may lock a material when, for example, the user has measured absorption coefficient values for the material and is confident in its accuracy.

Figure 10:
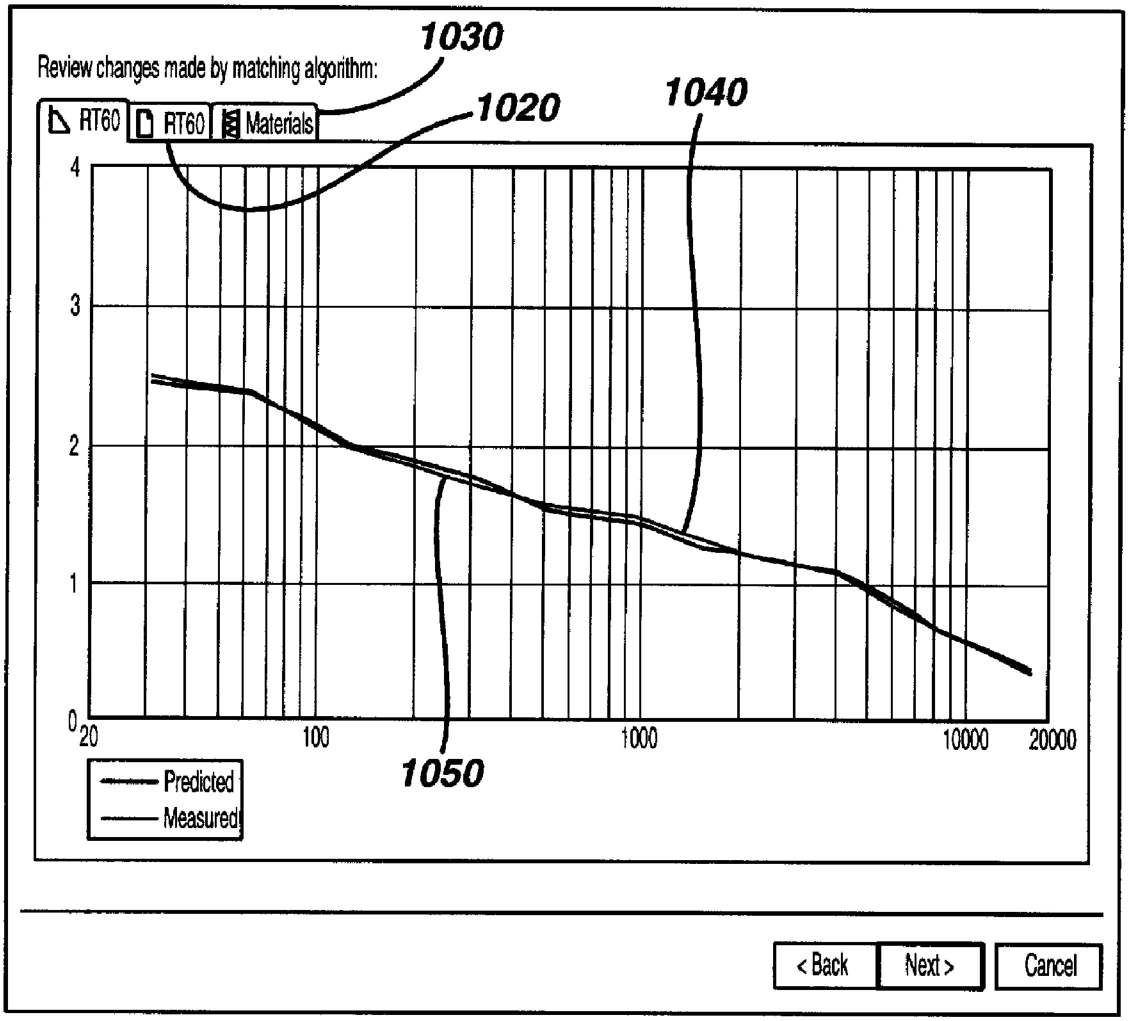
FIG. 10 illustrates a data window after the matching process of FIG. 7.

When the user selects the next button in FIG. 9, the reverberation time matching process is executed and the results displayed to the user as shown, for example, in FIG. 10. In FIG. 10, the measured reverberation time values are plotted as a function of frequency 1040 along with the new predicted reverberation time values 1050 to allow the user to graphically review the matching. The user may select another tab 1020, 1030 to view the matching results in different formats. For example, the user may select tab 1020 to view the differences between the measured and predicted reverberation time values in text form. If the user selects tab 1030, the user may review the adjustments to the material absorption coefficients made during the matching process.

Figure 11:
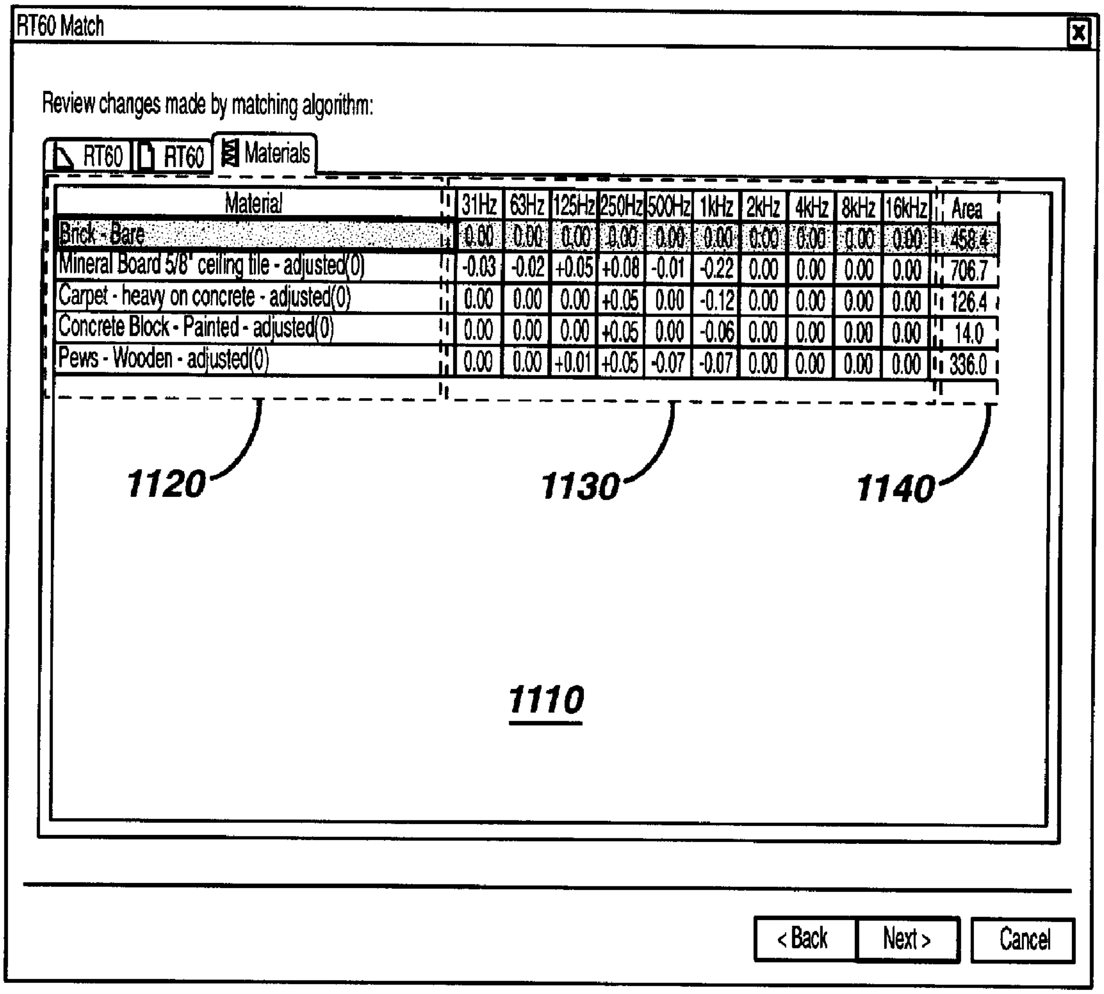
FIG. 11 illustrates another data window after the matching process of FIG. 7.

FIG. 11 displays the adjustments to the material absorption coefficients made during the match process. The material adjustment table 1110 displays a list of materials 1120, a list of surface areas associated with the material 1140, and the adjustments made to each absorption coefficient 1130. The materials in the materials list 1120 that have been adjusted are indicated in the materials list 1120. The adjustments portion 1130 of the table 1110 may be color-coded to indicate upward or downward adjustments to the absorption coefficient values. Materials that were locked show zero adjustments across the frequency spectrum such as "Brick—Bare" in FIG. 11.

Figure 12:
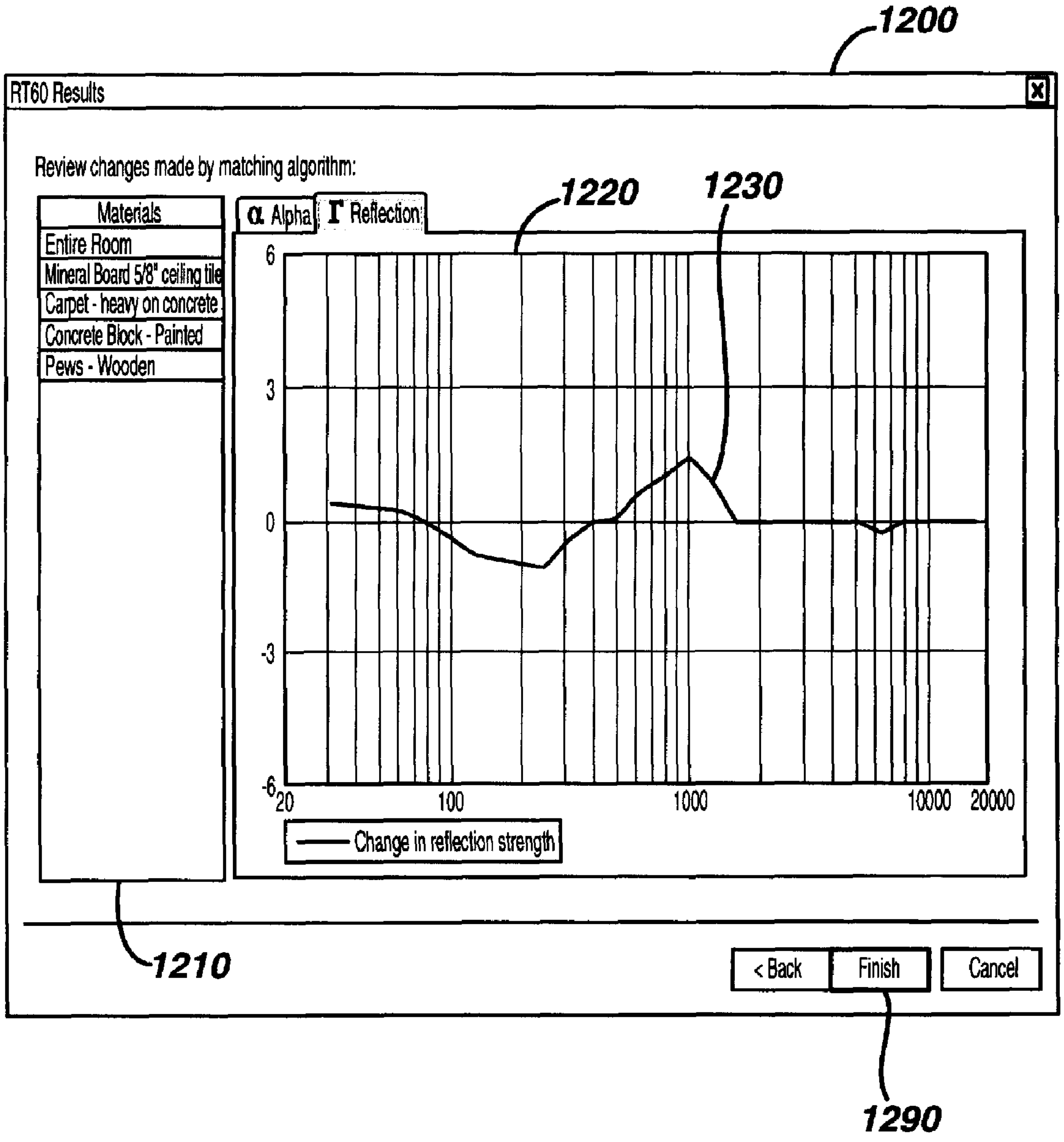
FIG. 12 illustrates another data window after the matching process of FIG. 7.

FIG. 12 displays the change in reflection strength of a selected material caused by the matching process. In FIG. 12, a window 1200 displays a list box 1210 listing the adjusted materials and a plot display area 1220 that shows a reflection strength as a function of frequency for the material selected in the list box 1210. For example, in FIG. 12, ⅝" mineral board has been selected and a plot 1230 of the reflection strength from the mineral board is displayed in the plot display area 1220. Plot 1230 indicates that at 1000 Hz, a ray reflecting from the mineral board is about 1.5 dB louder than a ray reflecting from an unadjusted mineral board. The user may undo the matching process by pressing the "Back" button or the user may accept the matching by pressing the "Finish" button 1290. When the user presses the "Finish" button, the adjusted absorption coefficients are used for subsequent calculations in place of the original default absorption coefficient values.

Embodiments of the systems and methods described above comprise computer components and computer-implemented steps that will be apparent to those skilled in the art. For example, it should be understood by one of skill in the art that portions of the audio engine, model manager, user interface, and audio player may be implemented as computer-implemented steps stored as computer-executable instructions on a computer-readable medium such as, for example, floppy disks, hard disks, optical disks, Flash ROMS, nonvolatile ROM, flash drives, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the present invention.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. An audio simulation system comprising:

a model manager configured to enable a user to build a 3-dimensional model of a venue and place and aim one or more loudspeakers in the model;

a user interface configured to associate a material with a surface in the 3-dimensional model and to receive at least one measured reverberation time value;

an audio engine configured to adjust an absorption coefficient of the material such that a predicted reverberation time value matches the at least one measured RT value; and an audio player generating at least two acoustic signals simulating an audio program played over the one or more loudspeakers in the model, the simulated audio program based on the adjusted absorption coefficient.

2. The audio simulation system of claim 1 wherein the predicted reverberation time value matches the at least one measured reverberation time value to within 0.5 seconds.

3. The audio simulation system of claim 1 wherein the predicted reverberation time value matches the at least one measured reverberation time value to within 0.05 seconds.

4. The audio simulation system of claim 1 wherein each material is characterized by an index and adjusted according to its index.

5. The audio simulation system of claim 4 wherein the index is a product of a surface area associated with the material and a reflection coefficient of the material.

6. The audio simulation system of claim 4 wherein the absorption coefficient of the material is adjusted according to a surface area associated with the material.

7. The audio simulation system of claim 4 wherein the absorption coefficient of the material is adjusted according to a reflection coefficient of the material.

8. The audio simulation system of claim 1 wherein the at least one measured reverberation time value is an RT60 value.

* * * * *